US009899282B2

(12) United States Patent
Partington

(10) Patent No.: US 9,899,282 B2
(45) Date of Patent: Feb. 20, 2018

(54) ROBUST HIGH PERFORMANCE SEMICONDUCTOR PACKAGE

(71) Applicant: Infineon Technologies Americas Corp., El Segundo, CA (US)

(72) Inventor: Wayne Partington, Worcester, MA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/148,144

(22) Filed: May 6, 2016

(65) Prior Publication Data

US 2017/0025319 A1 Jan. 26, 2017

Related U.S. Application Data

(60) Provisional application No. 62/196,799, filed on Jul. 24, 2015.

(51) Int. Cl.
| | |
|---|---|
| *H01L 23/057* | (2006.01) |
| *H01L 23/24* | (2006.01) |
| *H01L 23/00* | (2006.01) |
| *H01L 23/367* | (2006.01) |
| *H01L 23/498* | (2006.01) |

(Continued)

(52) U.S. Cl.
CPC ............ *H01L 23/057* (2013.01); *H01L 23/24* (2013.01); *H01L 23/3675* (2013.01); *H01L 23/42* (2013.01); *H01L 23/49838* (2013.01); *H01L 23/562* (2013.01); *H01L 25/0655* (2013.01); *H01L 25/072* (2013.01); *H05K 1/0216* (2013.01); *H01L 25/162* (2013.01); *H01L 25/18* (2013.01); *H05K 1/117* (2013.01); *H05K 2201/1034* (2013.01);

(Continued)

(58) Field of Classification Search
None
See application file for complete search history.

(56) References Cited

U.S. PATENT DOCUMENTS 5,093,989 A * 3/1992 Beltz .................. H01L 21/50
174/544
5,844,305 A * 12/1998 Shin .................. H01L 23/49582
257/666

(Continued)

*Primary Examiner* — Charles Garber
*Assistant Examiner* — Alia Sabur
(74) *Attorney, Agent, or Firm* — Slater Matsil LLP

(57) ABSTRACT

A semiconductor package includes a suspended substrate having one or more semiconductor devices thereon, a metallic case covering the suspended substrate, the suspended substrate being supported by a plurality of mechanical leads on opposing sides of the semiconductor package, at least one of the plurality of mechanical leads having a coefficient of thermal expansion (CTE) that substantially matches a CTE of the suspended substrate, where at least one of the plurality of mechanical leads is electrically connected to the suspended substrate, and where the plurality of mechanical leads absorb mechanical shocks so as to prevent damage to the semiconductor package. The semiconductor package also includes a thermal gel between the suspended substrate and the metallic case. The suspended substrate can be a printed circuit board. The metallic case includes mounting ears for transferring heat away from the semiconductor package.

20 Claims, 3 Drawing Sheets

(51) Int. Cl.
*H01L 25/065* (2006.01)
*H01L 25/07* (2006.01)
*H01L 23/42* (2006.01)
*H05K 1/02* (2006.01)
H01L 25/16 (2006.01)
H01L 25/18 (2006.01)
H05K 1/11 (2006.01)

(52) U.S. Cl.
CPC .............. *H05K 2201/10295* (2013.01); *H05K 2201/10371* (2013.01); *H05K 2201/10424* (2013.01)

(56) References Cited

U.S. PATENT DOCUMENTS

| | | |
|---|---|---|
| 7,765,687 B2 | 8/2010 | Pitzele |
| 8,644,027 B2 | 2/2014 | Pitzele |
| 2007/0089293 A1* | 4/2007 | Pitzele ................. H05K 7/1417 29/855 |
| 2008/0157336 A1* | 7/2008 | Yang ................... H01L 21/6835 257/690 |
| 2009/0260226 A1* | 10/2009 | Tinguely ............... B81B 7/0058 29/739 |
| 2011/0042137 A1* | 2/2011 | Eskridge ............... B81B 7/0048 174/536 |

* cited by examiner

ROBUST HIGH PERFORMANCE SEMICONDUCTOR PACKAGE

The present application claims the benefit of and priority to a provisional patent application entitled "Robust High Performance Semiconductor Package," Ser. No. 62/196,799 filed on Jul. 24, 2015. The disclosure in this provisional application is hereby incorporated fully by reference into the present application.

BACKGROUND

Semiconductor power modules control electrical power to circuits and devices, such as motors, actuators, controllers or the like. When high reliability is required for use in extreme or harsh environments, such as in high performance vehicles, aircrafts, space shuttles and satellites, it is important to provide semiconductor packages that are mechanically robust and thermally efficient. For example, in some space and satellite applications, semiconductor packages with power semiconductor devices require packaging of high thermal conductivity in order to maintain useful operation of the devices. However, most packaging materials with good thermal characteristics do not offer matching substrate to package coefficient of thermal expansion (CTE).

In a conventional semiconductor package, a substrate is attached to a package using hardware and hard soldering paste, which make the semiconductor package rigid and prone to damages caused by, for example, mechanical shocks. The contact points between the package and the substrate consume the limited usable area of the substrate. Moreover, due to a mismatch of coefficient of thermal expansion (CTE) between the substrate and the packaging material, the substrate and the package experience volume expansion and contraction at different rates, thereby introducing thermal stress that can damage the power semiconductor devices and circuitry on the substrate.

Accordingly, there is a need to overcome the drawbacks and deficiencies in the art by providing a robust high performance semiconductor package that is thermally efficient and shock resistant.

SUMMARY

The present disclosure is directed to a robust high performance semiconductor package, substantially as shown in and/or described in connection with at least one of the figures, and as set forth in the claims.

DETAILED DESCRIPTION

Figure 1A:
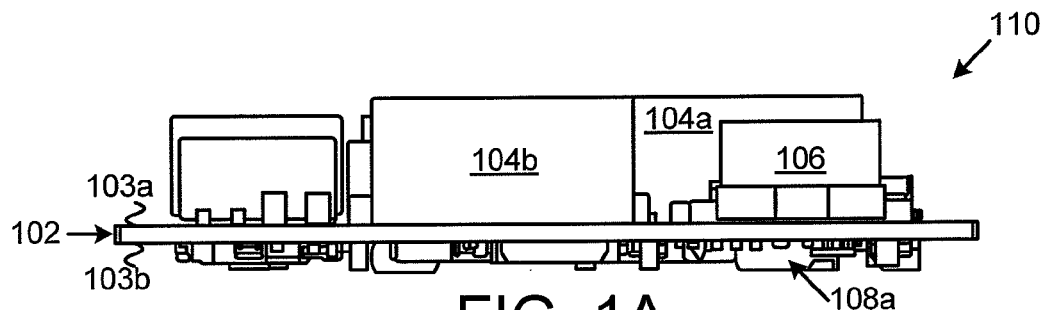
FIG. 1A illustrates a side view of a substrate assembly, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
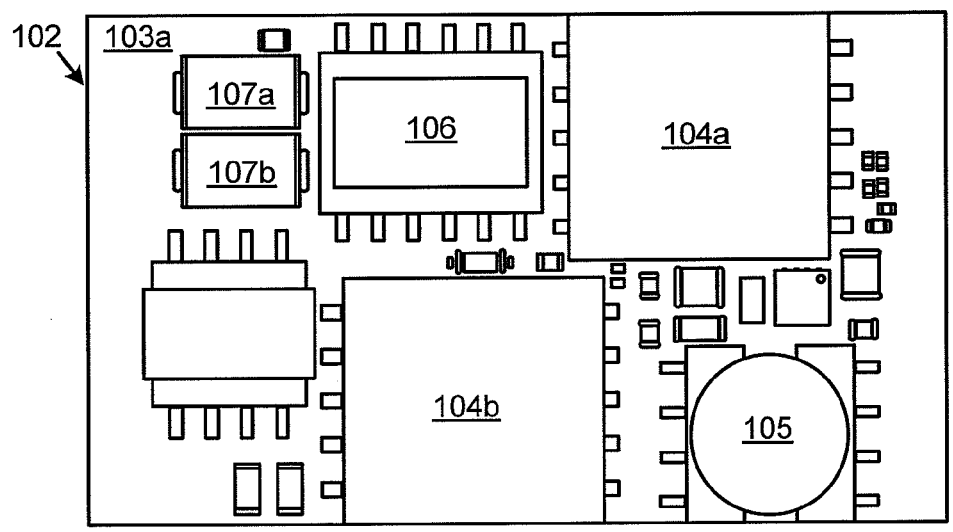
FIG. 1B illustrates a top view of a substrate assembly, according to one implementation of the present application.
Figure 1C:
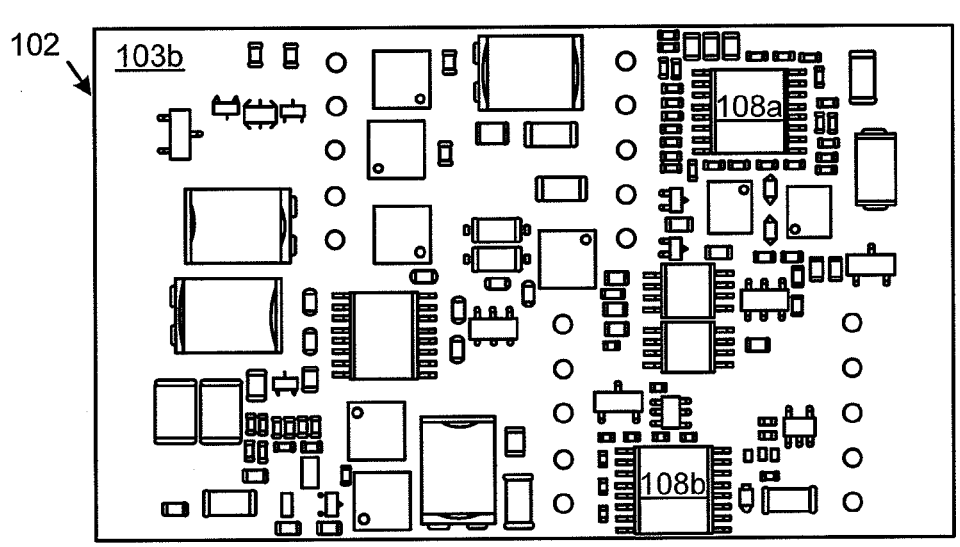
FIG. 1C illustrates a bottom view of a substrate assembly, according to one implementation of the present application.

FIG. 1 illustrates a side view of a substrate assembly, according to one implementation of the present application. As illustrated in FIG. 1A, substrate assembly 110 includes substrate 102 and various electrical components and semiconductor devices integrated thereon. For example, as illustrated in FIGS. 1A-1C, transformers 104a and 104b, toroidal inductor 105, tantalum capacitor 106, ceramic capacitor stacks 107a and 107b, and various electrical components and semiconductor devices are situated on top side 103a of substrate 102. Semiconductor devices 108a and 108b, and various electrical components and semiconductor devices, are situated on bottom side 103b of substrate 102.

In one implementation, substrate assembly 110 may include a power conversion circuit, such as a point of load converter formed thereon. For example, substrate assembly 110 may include a pulse width modulator configured to generate control signals, which are pulse width modulated control signals. In one implementation, the pulse width modulator can perform two and/or three phase pulse width modulation to drive an inverter circuit (e.g., having a two or three phase bridge connected circuit) integrated in substrate assembly 110. In another implementation, substrate assembly 110 can be a hybrid assembly having bare semiconductor dies and packaged integrated circuits directly attached thereto.

In the present implementation, substrate 102 is a double-sided substrate having top side 103a and bottom side 103b. In one implementation, substrate 102 is a single substrate, such as a printed circuit board (PCB), which allows one or more semiconductor dies and circuit elements to be attached to both sides of the substrate. By using both sides of a single substrate, for example, of uniform composition, substrate 102 does not require wafer bonding steps to bond two substrates together, for example, using copper, thereby reducing manufacturing complexity and cost. In one implementation, substrate 102 is a thick film substrate made of beryllium oxide (BeO). In another implementation, substrate 102 may include other suitable dielectric material, such as aluminum oxide (AlO).

As illustrated in FIG. 1B, transformers 104a and 104b, toroidal inductor 105, tantalum capacitor 106, ceramic capacitor stacks 107a and 107b, and various electrical components and semiconductor devices, are formed on top side 103a of substrate 102. In one implementation, transformers 104a and 104b are configured to, for example, either increase or decrease a voltage and/or current levels of their respective supplies. In one implementation, toroidal inductor 105 is configured to, for example, filter and reduce noise in the circuitry formed in substrate assembly 110. In one implementation, tantalum capacitor 106 is configured to, for example, reduce an output noise of a point of load converter formed in substrate assembly 110. In one implementation, ceramic capacitor stacks 107a and 107b are configured to, for example, filter an input noise of the point of load converter formed in substrate assembly 110.

As illustrated in FIG. 1C, semiconductor devices 108*a* and 108*b*, and various electrical components and semiconductor devices, are situated on bottom side 103*b* of substrate 102. In the present implementation, semiconductor devices 108*a* and 108*b* may each include one or more semiconductor dies. For example, each of the semiconductor dies may include a pulse width modulator and various other circuits monolithically integrated thereon (not explicitly shown in FIG. 1C). In one implementation, the semiconductor dies in semiconductor devices 108*a* and 108*b* may include silicon. In another implementation, the semiconductor dies in semiconductor devices 108*a* and 108*b* may include other suitable semiconductor material such as silicon-on-sapphire (SOS), silicon carbide (SiC), or the like. In another implementation, the semiconductor dies in semiconductor devices 108*a* and 108*b* may include other suitable semiconductor material such as group III-V material (e.g., GaN and AlGaN), or the like.

In one implementation, semiconductor devices 108*a* and 108*b* may each include one or more power semiconductor devices (not explicitly shown in FIG. 1C). For example, semiconductor devices 108*a* and 108*b* may each include lateral and/or vertical conduction power semiconductor devices, such as field-effect transistors (FETs) or insulated-gate bipolar transistors (IGBTs), or the like.

As illustrated in FIG. 1C, semiconductor devices 108*a* and 108*b* are surface mounted to bottom side 103*b* of substrate 102. In one implementation, at least one of semiconductor devices 108*a* and 108*b* is electrically coupled to one or more circuit elements on top side 103*a* of substrate 102 through one or more through substrate vias (TSVs) (not explicitly shown in FIGS. 1A-1C) in substrate 102. In one implementation, one or more TSVs can be utilized to provide routing and/or electrical connection between various circuit elements on top side 103*a* of substrate 102 and semiconductor devices on bottom side 103*b* of substrate 102 in any desired manner.

Figure 2A:
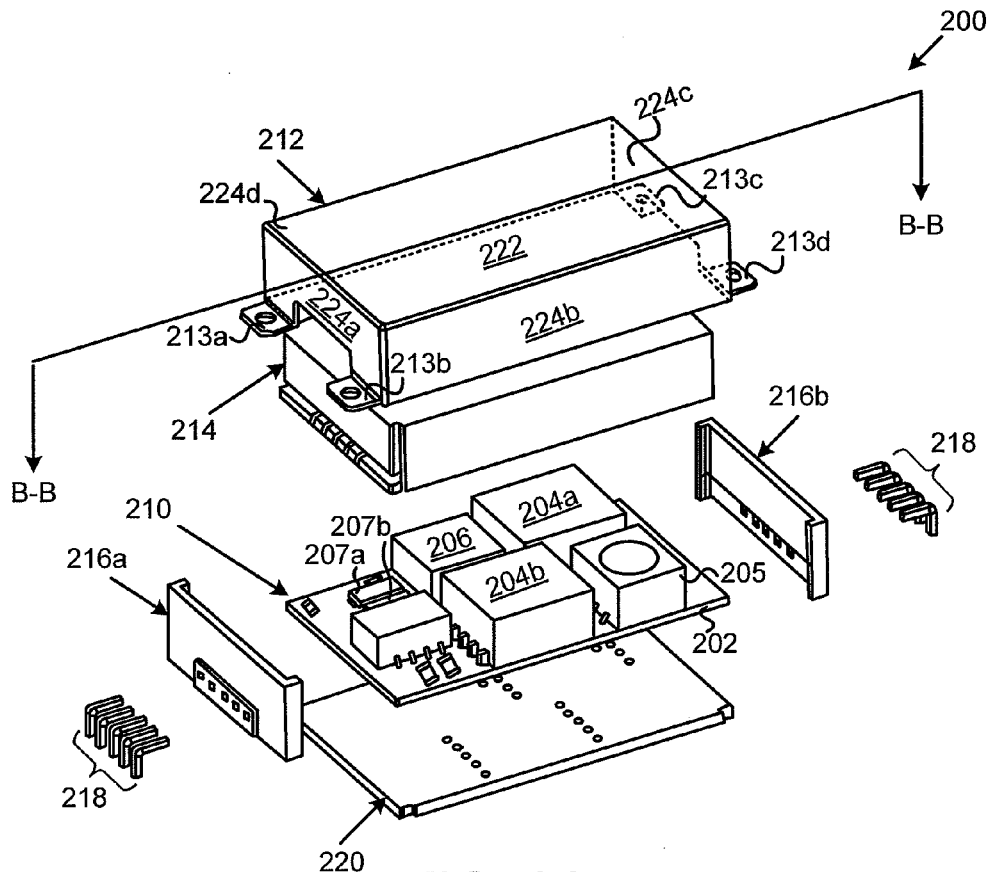
FIG. 2A illustrates a perspective view of a semiconductor package, according to one implementation of the present application.

Referring now to FIG. 2A, FIG. 2A illustrates a perspective view of a semiconductor package, according to one implementation of the present application. Semiconductor package 200 includes metallic case 212, substrate assembly 210, thermal gel 214, sidewall spacers 216*a* and 216*b*, mechanical leads 218, and hermetic lid 220.

In the present implementation, substrate assembly 210 corresponds to substrate assembly 110 shown in FIGS. 1A-1C. As illustrated in FIG. 2A, substrate assembly 210 includes substrate 202 and various electrical components and semiconductor devices integrated thereon. For example, transformers 204*a* and 204*b*, toroidal inductor 205, tantalum capacitor 206, ceramic capacitor stacks 207*a* and 207*b*, and various electrical components and semiconductor devices, are situated on top side 203*a* of substrate 202. Although not explicitly shown in FIG. 2A, it should be understood that semiconductor devices, such as semiconductor devices 108*a* and 108*b* and various electrical components and semiconductor devices shown in FIG. 1C, are situated on bottom side 203*b* of substrate 202.

As illustrated in FIG. 2A, metallic case 212 includes top portion 222, sidewalls 224*a*, 224*b*, 224*c* and 224*d* (hereinafter collectively referred to as "sidewalls 224"), and mounting ears 213*a*, 213*b*, 213*c* and 213*d* (hereinafter collectively referred to as "mounting ears 213"). In one implementation, metallic case 212 may have a substantially uniform composition. In another implementation, metallic case 212 may have a non-uniform composition.

In the present implementation, metallic case 212 includes a material with low mass, high thermal conductivity and high machinability. In the present implementation, metallic case 212 is configured to draw heat, for example generated during operation of circuit elements (e.g., transformers 204*a* and 204*b*), through top portion 222, sidewalls 224, and mounting ears 213. Mounting ears 213 are configured to be mounted to, for example, a heatsink (not explicitly shown in FIG. 2A), for transferring heat away from semiconductor package 200. In one implementation, metallic case 212 may also dissipate heat from substrate assembly 210 to the surrounding environment of semiconductor package 200.

In one implementation, metallic case 212 is a stamped aluminum case. The high thermal conductivity of aluminum facilitates transferring heat generated by circuit elements and power semiconductor devices on substrate assembly 210 out of semiconductor package 200. Metallic case 212 having aluminum is super lightweight, thereby substantially reducing the overall weight of semiconductor package 200. Moreover, aluminum is highly machinable, which means that the manufacturing process of metallic case 212 (e.g., stamping, cutting, removing portions thereof and obtaining a good finish) requires little power and time. With high machinability, it is also easy and quick to make configuration changes to accommodate different footprints of different substrates if needed. In other implementations, metallic case 212 may include other suitable material with low mass, high thermal conductivity and high machinability.

As illustrated in FIG. 2A, sidewall spacers 216*a* and 216*b* are disposed on two opposing sides of substrate assembly 210, and on the inside of sidewalls 224*a* and 224*c*, respectively, of metallic case 212. Sidewall spacers 216*a* and 216*b* include through holes, where mechanical leads 218 extend through the through holes to reach the interior of semiconductor package 200. In the present implementation, sidewall spacers 216*a* and 216*b* include insulative material, such as plastic, to electrically insulate mechanical leads 218 from one another. Sidewall spacers 216*a* and 216*b* can also provide structural support and spacing for mechanical leads 218.

In the present implementation, mechanical leads 218 are configured to extend through sidewall spacers 216*a* and 216*b* on opposing sides of metallic case 212 to reach to the interior of semiconductor package 200. In the present implementation, mechanical leads 218 are configured to extend under and in contact with bottom side 203*b* of substrate 202. In one implementation, mechanical leads 218 include conductive material, such that mechanical leads 218 are electrically coupled to semiconductor devices and/or circuit elements integrated on substrate 202 for external connection. For example, mechanical leads 218 may include metallic material, such as copper or copper-based metal matrix composite alloys. In another implementation, mechanical leads 218 may include insulative material. Mechanical leads 218 are configured to provide mechanical support to substrate assembly 210 in metallic case 212, such that substrate 202 is spaced away from and suspended in metallic case 212.

In the present implementation, mechanical leads 218 are configured to function as springs to absorb mechanical stress, for example, from mechanical shocks and other external disturbances to prevent damage to semiconductor package 200. Also, the CTE of mechanical leads 218 is closely matched with that of substrate 202. Thus, the thermal stress due to the CTE mismatch between metallic case 212 and substrate 202 is substantially eliminated by mechanical leads 218. As a result, a change in volume (e.g., expansion or contraction) of metallic case 212 in response to a change in temperature does not introduce thermal stress to substrate 202. It should be understood that mechanical leads 218 can be surface mounted, wire soldered, straight down through-hole mounted to another substrate or a heatsink.

Figure 2B:
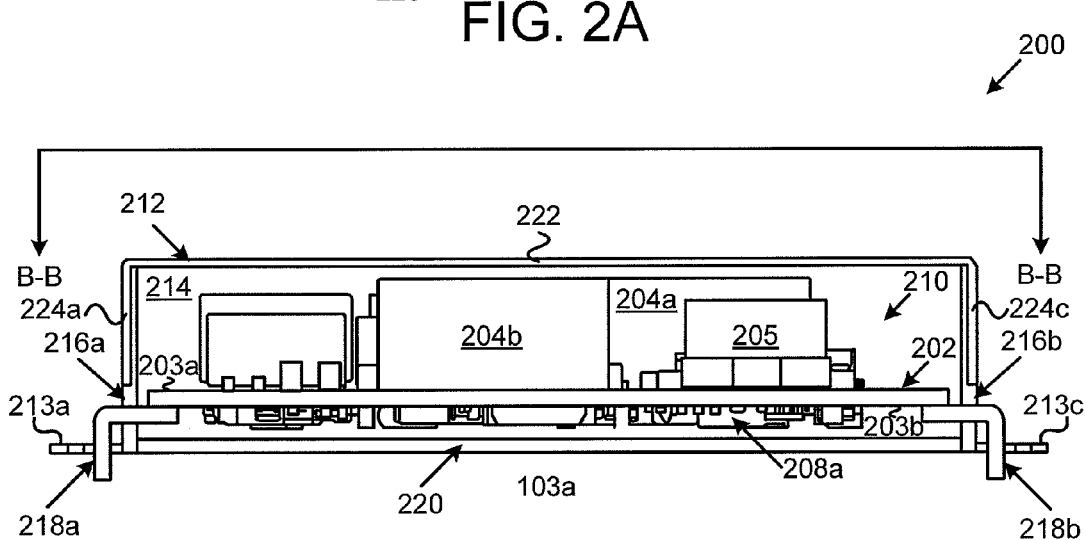
FIG. 2B illustrates a cross-sectional view of a semiconductor package, according to one implementation of the present application.

As illustrated in FIGS. 2A and 2B, hermetic lid 220 is situated at the bottom of metallic case 212 to hermetically seal substrate assembly 210 in semiconductor package 200. In one implementation, hermetic lid 220 includes a hard encapsulant. In another implementation, hermetic lid 220 includes a conductive lid. In yet another implementation, hermetic lid 220 is optional. As illustrated in FIGS. 2A and 2B, thermal gel 214 is disposed between substrate assembly 210 and metallic case 212. In one implementation, thermal gel 214 may partially or entirely fill the interior space between substrate assembly 210 and metallic case 212. In one implementation, thermal gel 214 may include a soft gel or potting with high thermal conductivity to transfer heat, for example generated from the circuit elements (e.g., transformers 204a and 204b) on substrate assembly 210, to metallic case 212. In one implementation, thermal gel 214 may have a thermal conductivity in a range between 0.1 W/mk and 10 W/mk. Thermal gel 214 is configured to transfer heat generated from the circuit elements (e.g., transformers 204a and 204b) on substrate assembly 210 to metallic case 212. In another implementation, thermal gel 214 may have a thermal conductivity that is less than 0.1 W/mk or greater than 10 W/mk.

Referring to FIG. 2B, FIG. 2B illustrates a cross-sectional view of a semiconductor package, according to one implementation of the present application. In the present implementation, FIG. 2B is a cross-sectional view of semiconductor package 200 along line B-B in FIG. 2A. With similar numerals representing similar features in FIG. 2A, semiconductor package 200 in FIG. 2B includes substrate assembly 210, metallic case 212, thermal gel 214, sidewall spacers 216a and 216b, mechanical leads 218a and 218b, and hermetic lid 220. As illustrated in FIG. 2B, substrate 202 is a suspended substrate having one or more semiconductor devices (e.g., semiconductor device 208a) thereon. Substrate 202 is supported by mechanical leads 218a and 218b on opposing sides of semiconductor package 200. In one implementation, at least one of mechanical leads 218a and 218b has a coefficient of thermal expansion (CTE) that substantially matches a CTE of substrate 202. In one implementation, each of mechanical leads 218a and 218b, and the rest of mechanical leads 218 shown in FIG. 2A, has a coefficient of thermal expansion (CTE) that substantially matches a CTE of substrate 202.

In the present implementation, substrate assembly 210 corresponds to substrate assembly 110 in FIGS. 1A-1C. As illustrated in FIG. 2B, substrate assembly 210 includes, among other electrical components and semiconductor devices, transformers 204a and 204b, and toroidal inductor 205 on top side 203a of substrate 202, and semiconductor device 208a on bottom side 203b of substrate 202.

As illustrated in FIG. 2B, mechanical lead 218a extends through sidewall spacer 216a on sidewall 224a of metallic case 212 and reaches the interior of metallic case 212 on one side of semiconductor package 200. Similarly, mechanical lead 218b extends through sidewall spacer 216b on sidewall 224c of metallic case 212 and reaches the interior of metallic case 212 on another side of semiconductor package 200. As such, mechanical leads 218, including mechanical leads 218a and 218b, provide mechanical support to substrate assembly 210 on bottom side 203b of substrate 202. As a result, substrate 202, thus substrate assembly 210, is spaced away from and suspended in metallic case 212. In the present implementation, mechanical leads 218 extend through sidewall spacers 216a and 216b on respective opposing sidewalls 224a and 224c of metallic case 212 to provide support to substrate assembly 210. It is noted that mechanical leads 218 do not extend through sidewalls 224b and 224d of metallic case 212 since mechanical leads 218 are sufficient to provide mechanical support for substrate assembly 210 on opposing sides of substrate 202 as shown. As a consequence, additional hardware is not required to secure substrate 202 in semiconductor package 200, thereby substantially reducing the overall weight of semiconductor package 200. Also, since mechanical leads 218 support substrate 202 at its edges, contact areas on a substrate that would have been reserved for the substrate to contact a case in a traditional semiconductor package can be eliminated, thereby allowing more circuit elements and semiconductor devices to be built on both sides of substrate 202. As such, a high density substrate can be obtained.

As illustrated in FIG. 2B, mechanical leads 218, including mechanical leads 218a and 218b may be soldered to bottom side 203b of substrate 202. As illustrated in FIGS. 2A and 2B, each of mechanical leads 218 is bent at an angle (e.g., approximately 90 degrees), where a substantially horizontal portion is connected to a substantially vertical portion. The substantially horizontal portion of each mechanical lead 218 extends from the exterior to the interior of semiconductor package 200, and is substantially parallel to substrate 202. The substantially horizontal portion of each mechanical lead 218 extends under and is attached to substrate 202, for example, by a solder paste. The substantially vertical portion of each mechanical lead 218 is on the exterior of semiconductor package 200, and is substantially parallel to sidewalls 224 of metallic case 212.

In the present implementation, mechanical leads 218 are configured to function as springs to absorb mechanical stress, for example, from mechanical shocks and other external disturbances to prevent damage to semiconductor package 200. Also, the CTE of mechanical leads 218 is closely matched with that of substrate 202. Thus, the thermal stress due to the CTE mismatch between metallic case 212 and substrate 202 is substantially eliminated by mechanical leads 218. As a result, a change in volume (e.g., expansion or contraction) of metallic case 212 in response to a change in temperature does not introduce stress to substrate 202.

In the present implementation, semiconductor package 200 has a length in a range between approximately 15 and 100 mm (i.e., $10^{-2}$ meters), a width in a range between approximately 15 and 100 mm, and a height in a range between approximately 5 and 50 mm. In another implementation, semiconductor package 200 may have other dimensions to suit the needs of a particular application.

Figure 3:
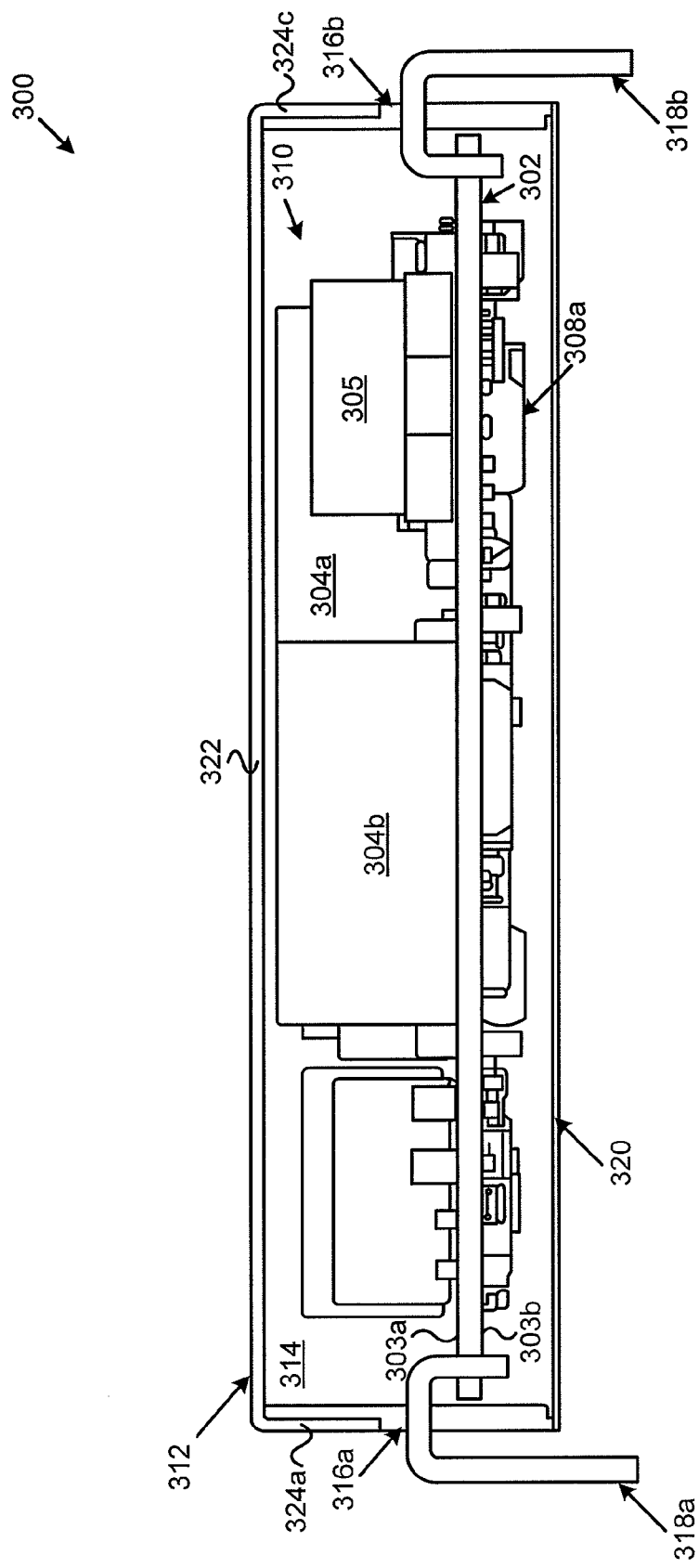
FIG. 3 illustrates a cross-sectional view of a semiconductor package, according to one implementation of the present application.

Referring to FIG. 3, FIG. 3 illustrates a cross-sectional view of a semiconductor package, according to one implementation of the present application. With similar numerals representing similar features in FIG. 2B, semiconductor package 300 in FIG. 3 includes substrate assembly 310, metallic case 312, thermal gel 314, sidewall spacers 316a and 316b, mechanical leads 318a and 318b, and hermetic lid 320.

In the present implementation, substrate assembly 310 corresponds to substrate assembly 110 in FIGS. 1A-1C, for example. As illustrated in FIG. 3, substrate assembly 310 includes substrate 302 and various electrical components and semiconductor devices integrated thereon. For example, as illustrated in FIG. 3, transformers 304a and 304b, toroidal inductor 305, and various electrical components and semiconductor devices, are situated on top side 303a of substrate 302. Also, semiconductor device 308a, and various electrical components and semiconductor devices, are situated on bottom side 303b of substrate 302. In the present implementation, transformers 304a and 304b, toroidal inductor 305 and semiconductor device 308a may correspond to transformers 204a and 204b, toroidal inductor 205 and semiconductor device 208a in FIG. 2B.

In the present implementation, metallic case 312 may correspond to metallic case 212 in FIGS. 2A and 2B. As illustrated in FIG. 3, metallic case 312 is a stamped aluminum case having top portion 322 and opposing sidewalls 324a and 324c. Although not explicitly shown in FIG. 3, it should be understood that metallic case 312 includes another pair of opposing sidewalls, similar to sidewalls 224b and 224d of metallic case 212 shown in FIG. 2A. It is noted that, in the present implementation, metallic case 312 may function as a heat spreader to dissipate heat from substrate assembly 310 to the surrounding environment of semiconductor package 300.

As illustrated in FIG. 3, each of mechanical leads 318a and 318b is bent at an angle (e.g., approximately 90 degrees) on the exterior of semiconductor package 300, and at another angle (e.g., approximately 90 degrees) on the interior of semiconductor package 300. Thus, mechanical leads 318a and 318b each include a substantially horizontal portion connected to a substantially vertical portion on the interior of semiconductor package 300 and another substantially vertical portion on the exterior of semiconductor package 300.

The substantially horizontal portion of mechanical lead 318a extends through sidewall spacer 316a on sidewall 324a of metallic case 312 to reach the interior of metallic case 312. The substantially vertical portion of mechanical lead 318a on the interior of semiconductor package 300 extends through substrate 302 on one end thereof, and is substantially parallel to sidewall 324a of metallic case 312. Similarly, the substantially horizontal portion of mechanical lead 318b extends through sidewall spacer 316b on sidewall 324c of metallic case 312 to reach the interior of metallic case 312. The substantially vertical portion of mechanical lead 318b on the interior of semiconductor package 300 extends through substrate 302 on another end thereof, and is substantially parallel to sidewall 324c of metallic case 312. Mechanical leads 318a and 318b are through-hole mounted to substrate 302, and provide mechanical support to substrate 302 to suspend substrate assembly 310 in metallic case 312.

In the present implementation, mechanical leads 318 are configured to function as springs to absorb mechanical stress, for example, from mechanical shocks and other external disturbances to prevent damage to semiconductor package 300. Also, the CTE of mechanical leads 318 is closely matched with that of substrate 302. Thus, the thermal stress due to the CTE mismatch between metallic case 312 and substrate 302 is substantially eliminated by mechanical leads 318. As a result, a change in volume (e.g., expansion or contraction) of metallic case 312 in response to a change in temperature does not introduce stress to substrate 302. It should be understood that mechanical leads 318 can be surface mounted, wire soldered, or straight down through-hole mounted to another substrate or a heatsink.

As illustrated in FIG. 3, hermetic lid 320 is situated at the bottom of metallic case 312 to hermetically seal substrate assembly 310 in semiconductor package 300. In the present implementation, mechanical leads 318 are configured to function as springs to absorb mechanical stress, for example, from shocks and other external disturbances to prevent damage to semiconductor package 300. As illustrated in FIG. 3, thermal gel 314 is disposed between substrate assembly 310 and metallic case 312. In one implementation, thermal gel 314 may partially or entirely fill the interior space between substrate assembly 310 and metallic case 312. In one implementation, thermal gel 314 may include a soft gel or potting with high thermal conductivity to transfer heat, for example generated from the circuit elements (e.g., transformers 304a and 304b) on substrate assembly 310, to metallic case 312. In one implementation, thermal gel 314 may have a thermal conductivity in a range between 0.1 W/mk and 10 W/mk. In another implementation, thermal gel 314 may have a thermal conductivity that is less than 0.1 W/mk or greater than 10 W/mk.

In the present implementation, semiconductor package 300 has a length in a range between approximately 15 and 100 mm, a width in a range between approximately 15 and 100 mm, and a height in a range between approximately 5 and 50 mm. In another implementation, semiconductor package 300 may have other dimensions to suit the needs of a particular application.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
a suspended substrate having one or more semiconductor devices thereon;
a metallic case covering said suspended substrate, the metallic case comprising a metallic sidewall;
a first sidewall and a second sidewall disposed on opposite sides of the suspended substrate, the first and the second sidewalls comprising an insulating material, wherein a portion of the metallic sidewall overlaps a portion of the first sidewall;
a plurality of leads extending through the first sidewall and the second sidewall without directly contacting the metallic case, said suspended substrate being supported by the plurality of leads on opposing sides of said semiconductor package; and
at least one of said plurality of leads having a coefficient of thermal expansion (CTE) that substantially matches a CTE of said suspended substrate.

2. The semiconductor package of claim 1 wherein at least one of said plurality of leads is electrically connected to said suspended substrate.

3. The semiconductor package of claim 1 wherein each of said plurality of leads has a CTE that substantially matches a CTE of said suspended substrate.

4. The semiconductor package of claim 1 wherein said plurality of leads absorb mechanical shocks so as to prevent damage to said semiconductor package.

5. The semiconductor package of claim 1 further comprising a thermal gel between said suspended substrate and said metallic case.

6. The semiconductor package of claim 1 wherein said suspended substrate is a printed circuit board.

7. The semiconductor package of claim 1 wherein said metallic case includes mounting ears for transferring heat away from said semiconductor package.

8. A semiconductor package comprising:
a suspended substrate having one or more semiconductor devices thereon;
a metallic case covering said suspended substrate, the metallic case comprising a metallic sidewall;
a first sidewall and a second sidewall disposed on opposite sides of the suspended substrate, the first and the second sidewalls comprising an insulating material, wherein a portion of the metallic sidewall overlaps a portion of the first sidewall;
a plurality of leads extending through the first sidewall and the second sidewall without directly contacting the metallic case, said suspended substrate being supported by the plurality of leads on opposing sides of said semiconductor package;
at least one of said plurality of leads having a horizontal portion that extends under and is attached to said suspended substrate; and
said plurality of leads having a coefficient of thermal expansion (CTE) that substantially matches a CTE of said suspended substrate.

9. The semiconductor package of claim 8 wherein at least one of said plurality of leads is electrically connected to said suspended substrate.

10. The semiconductor package of claim 8 wherein each of said plurality of leads has a CTE that substantially matches a CTE of said suspended substrate.

11. The semiconductor package of claim 8 wherein said plurality of leads absorb mechanical shocks so as to prevent damage to said semiconductor package.

12. The semiconductor package of claim 8 further comprising a thermal gel between said suspended substrate and said metallic case.

13. The semiconductor package of claim 8 wherein said suspended substrate is a printed circuit board.

14. The semiconductor package of claim 8 wherein said metallic case includes mounting ears for transferring heat away from said semiconductor package.

15. A semiconductor package comprising:
a suspended substrate having one or more semiconductor devices thereon;
a metallic case covering said suspended substrate;
a first sidewall and a second sidewall disposed on opposite sides of the suspended substrate, the first and the second sidewalls comprising an insulating material, the first sidewall intersecting with a first sidewall of the metallic case, the second sidewall intersecting with a second sidewall of the metallic case;
a plurality of mechanical leads extending through the first sidewall and the second sidewall without directly contacting the metallic case, said suspended substrate being supported by the plurality of mechanical leads on opposing sides of said semiconductor package;
at least one of said plurality of mechanical leads having a vertical portion that extends through said suspended substrate; and
said plurality of mechanical leads having a coefficient of thermal expansion (CTE) that substantially matches a CTE of said suspended substrate.

16. The semiconductor package of claim 15 wherein at least one of said plurality of mechanical leads is electrically connected to said suspended substrate.

17. The semiconductor package of claim 15 wherein each of said plurality of mechanical leads has a CTE that substantially matches a CTE of said suspended substrate.

18. The semiconductor package of claim 15 wherein said plurality of mechanical leads absorb mechanical shocks so as to prevent damage to said semiconductor package.

19. The semiconductor package of claim 15 further comprising a thermal gel between said suspended substrate and said metallic case.

20. The semiconductor package of claim 15 wherein said suspended substrate is a printed circuit board.

* * * * *